United States Patent
Chen et al.

(10) Patent No.: US 8,987,689 B2
(45) Date of Patent: Mar. 24, 2015

(54) EFFICIENT SCAN FOR E-BEAM LITHOGRAPHY

(75) Inventors: Cheng-Hung Chen, Changhua (TW); Shih-Chi Wang, Taipei (TW); Jeng-Horng Chen, Hsin-Chu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/484,524

(22) Filed: May 31, 2012

(65) Prior Publication Data

US 2013/0320243 A1    Dec. 5, 2013

(51) Int. Cl.
*A61N 5/00* (2006.01)
(52) U.S. Cl.
USPC ...................................................... 250/492.1
(58) Field of Classification Search
USPC ................... 250/492.1, 492.2, 492.3, 492.22, 250/492.23
See application file for complete search history.

(56) References Cited

U.S. PATENT DOCUMENTS

| | | | | |
|---|---|---|---|---|
| 6,114,709 | A * | 9/2000 | Nakasuji | 250/492.23 |
| 2005/0273753 | A1* | 12/2005 | Sezginer | 716/21 |
| 2011/0073782 | A1* | 3/2011 | Wieland | 250/492.22 |
| 2011/0226970 | A1* | 9/2011 | Krecinic et al. | 250/492.22 |
| 2012/0286170 | A1* | 11/2012 | Van De Peut et al. | 250/397 |

* cited by examiner

*Primary Examiner* — Phillip A Johnston
*Assistant Examiner* — Jason McCormack
(74) *Attorney, Agent, or Firm* — Haynes and Boone, LLP

(57) ABSTRACT

The present disclosure provides a method of increasing the wafer throughput by an electron beam lithography system. The method includes scanning a wafer using the maximum scan slit width (MSSW) of the electron beam writer. By constraining the integrated circuit (IC) field size to allow the MSSW to cover a complete field, the MSSW is applied to decrease the scan lanes of a wafer and thereby increase the throughput. When scanning the wafer with the MSSW, the next scan lane data can be rearranged and loaded into a memory buffer. Thus, once one scan lane is finished, the next scan lane data in the memory buffer is read for scanning.

20 Claims, 7 Drawing Sheets

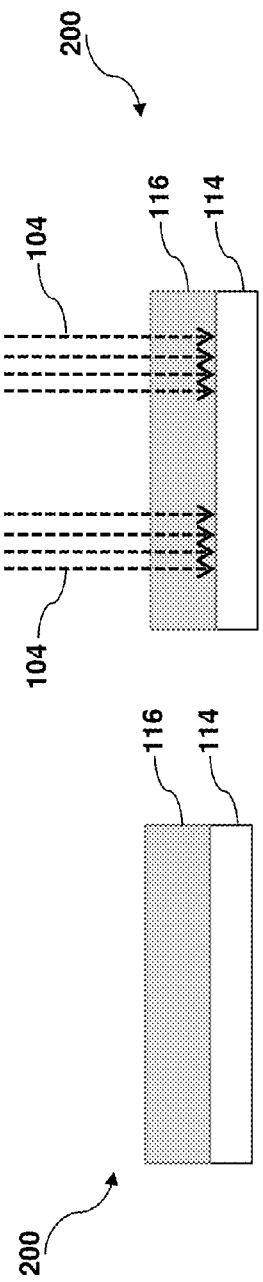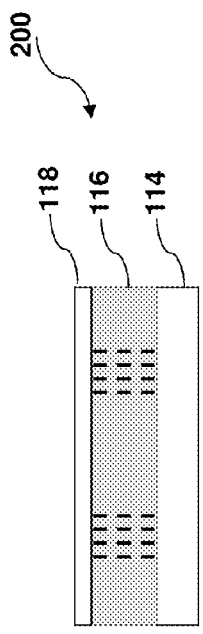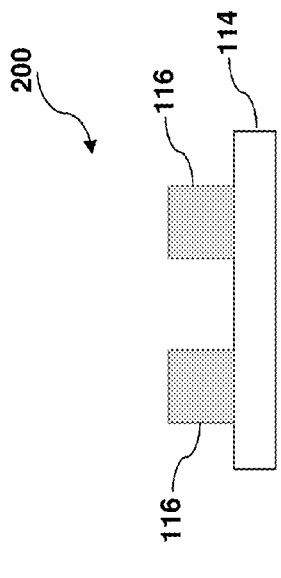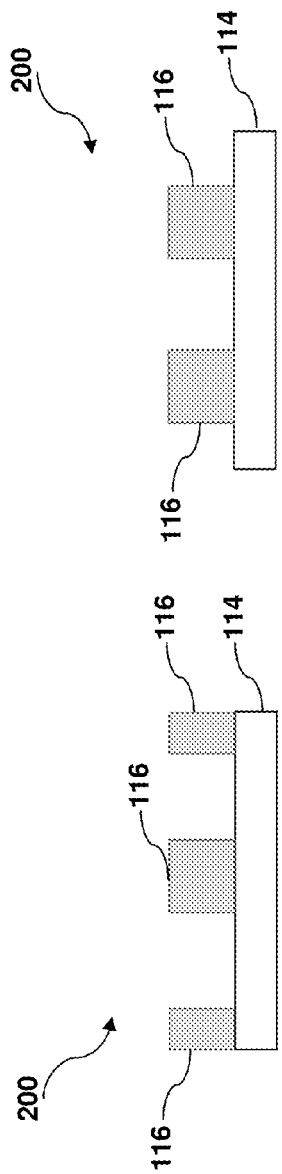

EFFICIENT SCAN FOR E-BEAM LITHOGRAPHY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, light diffraction in an optical lithography system becomes an obstacle for further scaling down the geometry size. Common techniques used to decrease the light diffraction impact, include optical proximity correction (OPC), phase shift mask (PSM), and immersion optical lithography system. An electron beam lithography system is another alternative to scale down the feature size. However, wafer throughput by electron beam lithography system is a major issue for large scale fabrication in the IC industry.

Accordingly, what is needed is a method to increase the wafer throughput for the electron beam lithography system.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-6 are cross-sectional side views illustrating forming a resist pattern according to one or more embodiments of the present disclosure.

DETAILED DESCRIPTION

Figure 1:
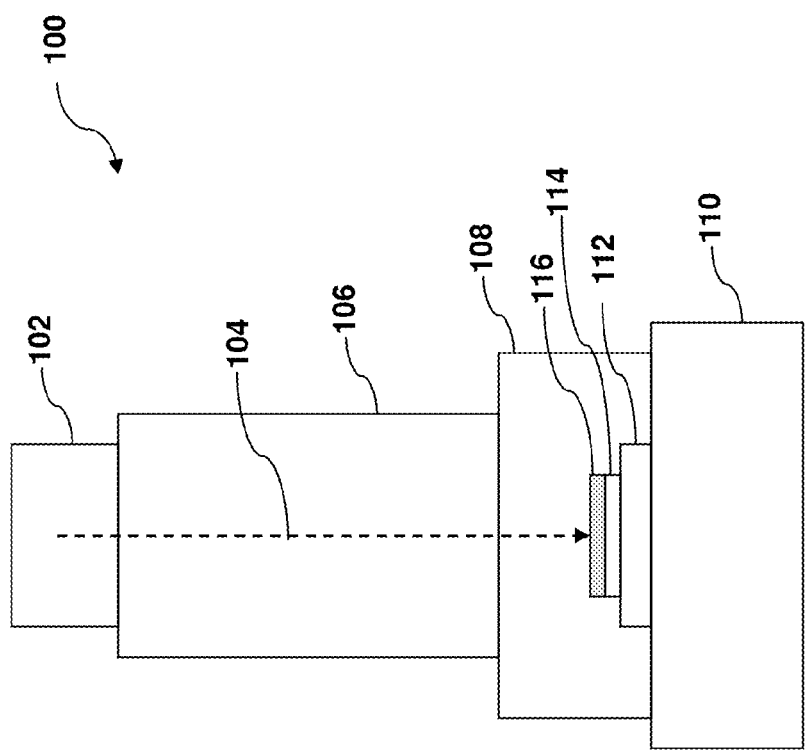
FIG. 1 represents a schematic diagram of an electron beam writer system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an electron beam lithography system 100 includes an electron source 102, an electron beam 104, an electron optical column 106, a chamber 108, a pump unit 110, and a wafer stage 112 according to one or more embodiments of the present disclosure. However, other configurations and inclusion or omission of devices may be possible. In the present disclosure, the electron beam lithography system is also referred to as an electron beam writer or an electron beam writer system. The electron resource 102 provides the electrons emitted from a conducting material by heating the conducting material to a very high temperature, where the electrons have sufficient energy to overcome the work function barrier and escape from the conducting material (thermionic sources), or by applying an electric field sufficiently strong that the electron tunnel through the barrier (field emission sources). The electron optical column 106 is comprised of electromagnetic apertures, electrostatic lenses, electromagnetic lenses, shaping deflector and cell selection deflector; and provides a plurality of Gaussian spot electron beams, variable shaped electron beams and cell projection electron beams. The chamber 108 is comprised of a wafer loading and unloading unit, and provides the wafer transportation without interrupting the vacuum of the system. The pump unit 110 includes one or more pumps and provides a high vacuum environment for the electron beam writer system. The wafer stage 112 is comprised of motors, roller guides, and tables; and provides the accurate position and movement for a wafer substrate 114, secured on the wafer stage 112 by vacuum, in X, Y and Z directions during focus, leveling and exposure process of the wafer in the electron beam lithography system.

Continuing with the present embodiment, the wafer substrate 114 includes a resist film 116, and is loaded on the wafer stage 112 for electron beam exposure. The wafer substrate 114 includes a silicon wafer. Alternatively or additionally, the wafer may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive material may include a metal such as aluminum (Al), Copper (Cu), tungsten (W), nickel (Ni), titanium (Ti), gold (Au), and platinum (Pt) and, thereof an alloy of the metals. The insulator material may include silicon oxide and silicon nitride.

Referring now to FIGS. 2-6, a process 200 can be used with the system 100 to implement one or more embodiments of the present invention. Referring to FIG. 2, the photo resist film 116 is coated on the wafer substrate 114 by a spin-on process followed by a soft bake (SB) process. In the present disclosure, the photo resist is also referred to as resist, and coating a photo resist is also referred to as depositing a photo resist. The resist film 116 includes a positive tone resist or a negative tone resist. The resist film 116 comprises a single resist film, or a multiple layers resist film. Referring to FIG. 3, the resist film 116 is exposed by a plurality of the electron beams 104 in the electron beam lithography system 100 as shown in FIG. 1 to form a latent image pattern inside the photo resist film 116. Referring to FIG. 4, after the exposure, a developer 118 is applied to the surface of the photo resist film 116 for developing a photo resist pattern. The develop process also includes a post exposure process (PEB) or a post develop bake (PDB). The final resist pattern is resist tone dependent. For example, if a positive tone photo resist is used, the polymer in the exposed area is dissolved during the developing process, and the final resist pattern is formed as show in FIG. 5. In another example, if a negative tone photo resist is used, the polymer in the exposed area is cross-linked during the developing process, and the final resist pattern is formed as show in FIG. 6.

Figure 7:
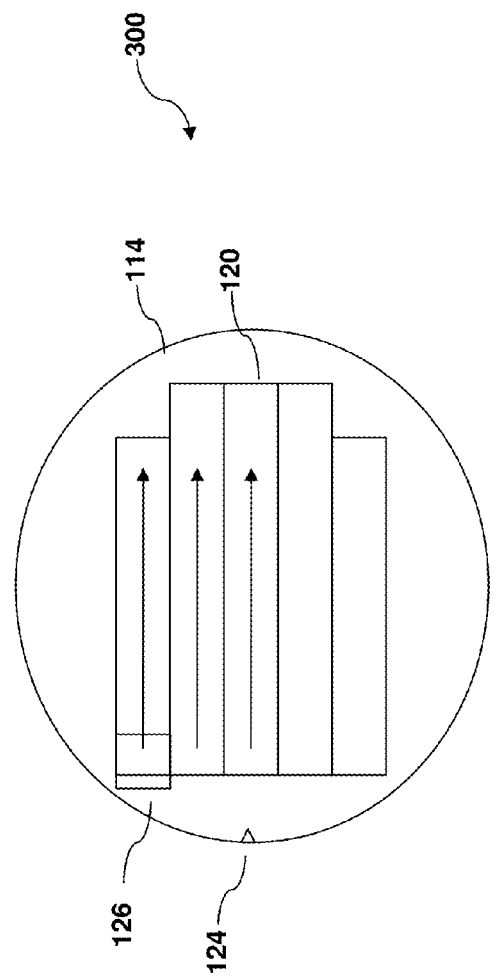
FIGS. 7-8 are diagrams of the scan movement on a wafer substrate in an electron beam writer system according to one or more embodiments of the present disclosure.
Figure 8:
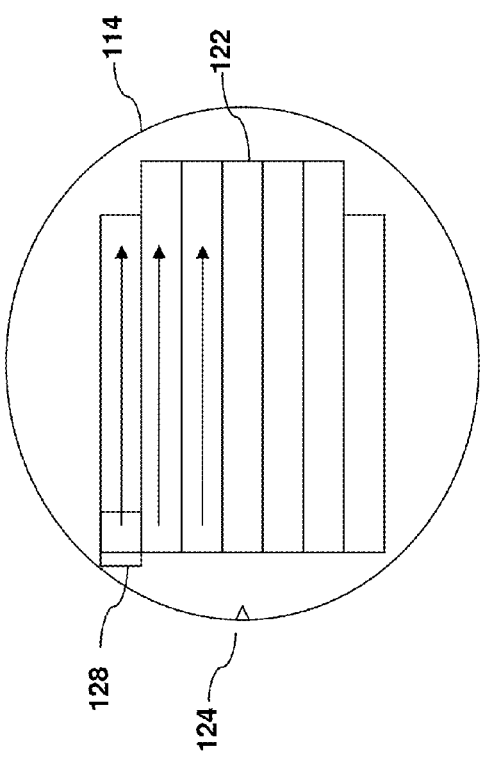

Referring now to FIGS. 7-8, a method 300 includes using a plurality of electron beams to expose the photo resist film 116 coated on the wafer substrate 114. In the present disclosure, "exposing a wafer" is also referred to as "scanning a wafer." As shown in FIG. 7, a wafer notch 124 is referred as the wafer bottom (shown on the left in the figure), and the electron beam is scanned from the wafer bottom to the wafer top. In the depicted embodiment, the electron beam scan direction is referred to as the y direction of the electron beam writer system 100, and the x direction is perpendicular to the y direction. According to one or more embodiments, an electron beam writer 100 has a constant scan size (e.g. 26×26 mm$^2$), which consists of a plurality of narrow patterned stripes based on individual data input. Due to the data transfer bandwidth, the electron beam scan data remains the same for each lane scan exposure as shown in FIGS. 7-8. Thus, for the maximum throughput of an electron beam writer 100, the IC design field size in x dimension matches the maximum scan width MSW of the electron beam system 100. As shown in FIG. 7, an IC design layout 120 has a design field width 126 (the size in x dimension) matching the maximum scan width MSW, less any scan lanes that are needed during exposure. As shown in FIG. 8, another IC design layout 122 has a design field width 128 that is smaller than the MSW. In this embodiment, more scan lanes are needed to expose a wafer, and therefore the throughput is lower by using a design field width smaller than the MSW.

For the sake of further example, the IC design illustrated in FIG. 7 has a field size of 26×33 mm$^2$ (26 mm in x dimension and 33 mm in y dimension). In this example, the electron beam needs to travel 11 scan lanes across a 300-mm wafer to expose all fields with correct input patterns. It is understood, however, that the actual IC field size on wafers varies from product to product. For another example, the IC design illustrated in FIG. 8 has a field size of 16×32 mm$^2$. In this example, the electron beam needs to travel 17 scan lanes across a 300-mm wafer to expose all fields with correct input pattern, which results in more exposure time needed for each wafer and therefore about forty percent (40%) loss of the throughput from the electron beam writer 100.

Figure 9:
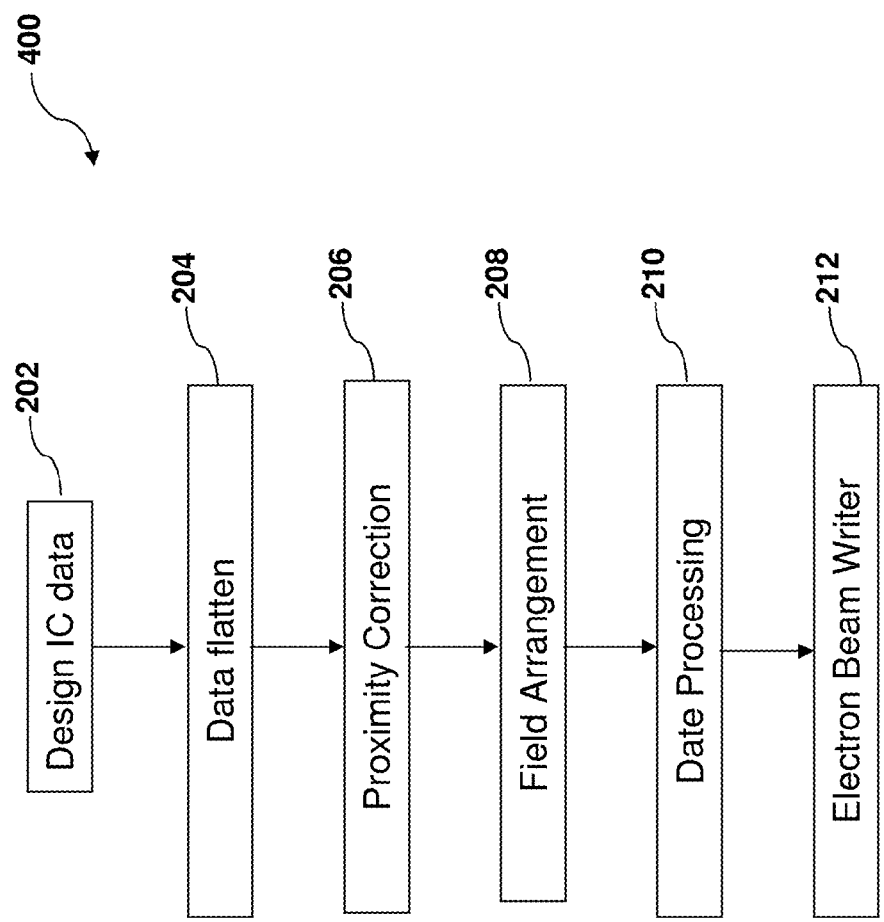
FIG. 9 is a flow chart of an IC design data flow in an electron beam writer system for implementing one or more embodiments of the present disclosure.

Referring now to FIG. 9, a method 400 of exposing a photo resist film on a wafer substrate on the electron beam lithography system 100 is illustrated for implementing one or more embodiments of the present disclosure. The method 400 begins at step 202 by receiving an IC layout pattern from a designer. The designer can be a separate design house or can be part of a semiconductor fabrication facility (fab) for making IC productions according to the IC design layout pattern. Execution proceeds to step 204 for a data flatten process. The data flatten process is to decompress original hierarchic data. At step 206, electron proximity correction (EPC) is performed. EPC is a compensation process for critical dimensions due to the electron scattering from the wafer substrate, and includes size bias, shape correction, dose correction and equalization of background dose correction (sometimes referred to as GHOST). The method 400 proceeds to step 208 for field arrangement. The field arrangement splits the field into a plurality of stripes and fills the stripes with the EPC modified design layout data. The stripes may include a plurality of sub-stripes and may further include a plurality of sub-sub-stripes. According to some embodiments of the present disclosure, at step 208, the IC layout data is arranged to fill up the MSSW to reach the maximum throughput by the electron beam writer. Execution then proceeds to step 210 for data processing. The data processing converts the pattern layout data to an electron beam format data, and sends the electron beam format data to an electron beam writer. Referring also to FIG. 1, execution then proceeds to step 212 for the electron beam writer 100 to expose the photo resist film 116 coated on a wafer substrate 114 by scanning the photo resist with electron beams.

Figure 10:
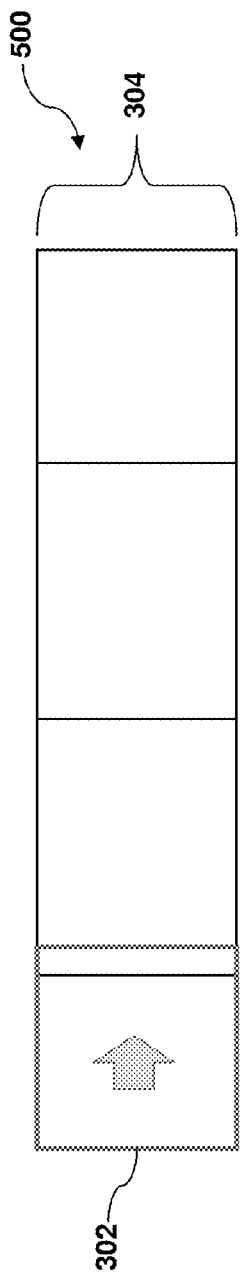
FIGS. 10-12 illustrate a scan method in an electron beam write according to one or more embodiments of the present disclosure.
Figure 11:
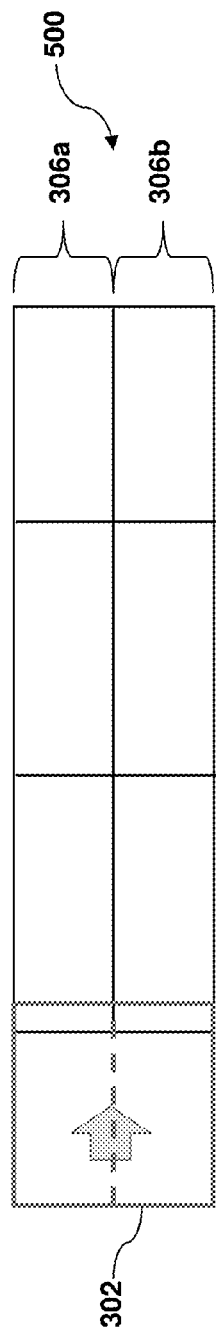
Figure 12:
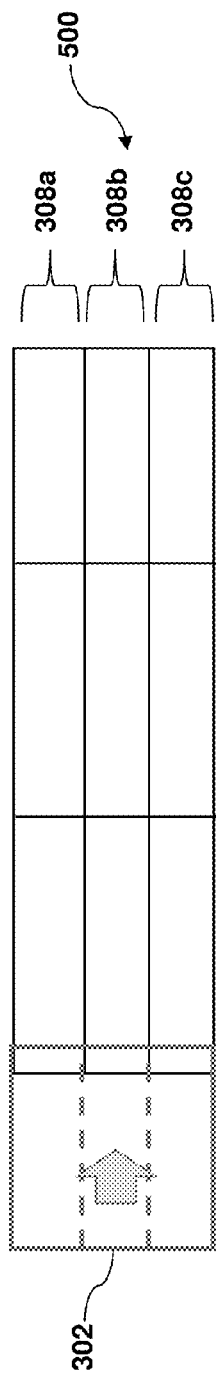

FIGS. 10-12 describe another method for exposing a photo resist film coated on a wafer substrate by using the MSW 302. In a method 500, a design constraint is used to select the IC design field width (IC field size in x dimension) by dividing the MSW 302 of an electron beam writer by a natural integer number (N). For example, if the MSW is 26 mm for an electron beam writer 100 (FIG. 1), the IC design field size in x direction will be 26 mm (the maximum scan width divided by the natural integer number N=1), 13 mm (the maximum scan width divided by the nature integer number N=2), 8.666 mm (the maximum scan width divided by the natural integer number N=3), and so on.

For one example, if the MSW is 26 mm for an electron beam writer and the IC design field size is constrained as 26 mm (N=1) in the x direction, one scan lane covers one complete field 304 in x direction and 11 scan lanes are needed to expose a 300 mm wafer as shown in FIG. 10. In another example, the IC design field size is constrained as 13 mm (N=2) in x direction for the same electron beam writer, one scan lane covers 2 complete fields 306a and 306b in x direction and 11 scan lanes are needed to expose a 300 mm wafer as shown in FIG. 11. In the third example, the IC design field size is constrained as 8.666 mm (N=3) for the same electron beam writer, one scan lane covers 3 complete fields 308a, 308b and 308c in x direction and 11 scan lanes are needed to expose a 300 mm wafer as shown in FIG. 12. Thus even for the small IC design field size, the MSW 302 is utilized in the method 500 to increase the throughput of the electron beam writer according to one or more embodiments of the present disclosure.

Figure 13:
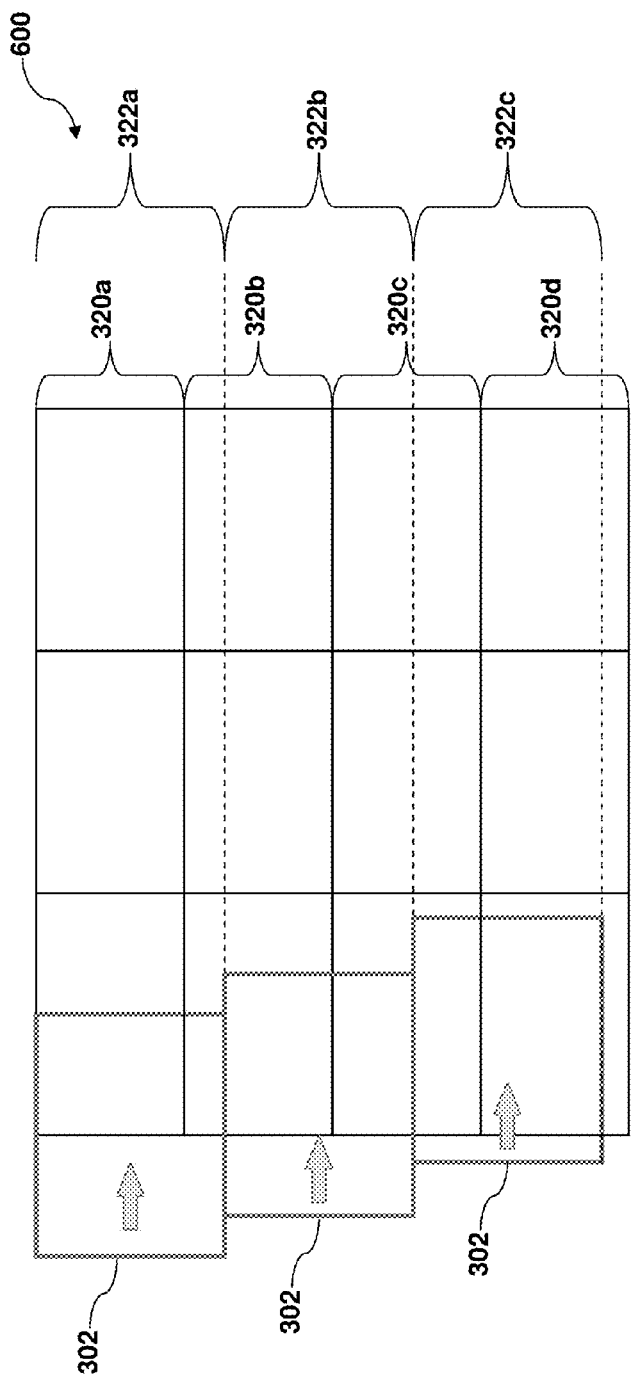
FIG. 13 is a diagram for arranging the data for each lane scan in an electron beam writer according to one or more embodiments of the present disclosure.
Figure 14:
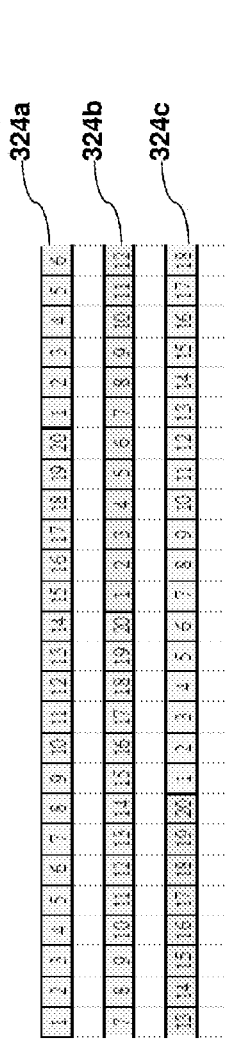
FIG. 14 represents a scan method in an electron beam write according to one or more embodiments of the present disclosure.

Referring now to FIGS. 13-14, a method 600 can be used to expose a photo resist film coated on a wafer substrate by using the MSW 302 according to one or more embodiments of the present disclosure. In the method 600, the IC field size in x direction is not constrained, and therefore the data input changes from lane to lane in order to utilize the MSW 302 for throughput improvement. The electron beam writer 100 still scans the wafer substrate lane by lane in consecutive order 322a, 322b, and 322c. Because the data input for each scan lane changes from lane to lane, the data for each scan lane needs to be rearranged. The data rearrangement can be done during the overhead time between lanes and a large memory buffer is needed for a scan lane data arrangement during one lane scanning.

For example, there are 26 stripes for an electron beam writer with a scan slit width 26 mm, and now the IC design field size is 20×33 mm² (20 mm in x dimension and 33 mm in y dimension). The IC field width (IC field size in x dimension) is 20 mm and only 20 stripes (indicated as numbers 1-20 in FIG. 14) are needed for a full row 320a, 320b, 320c, and 320d scan as shown in FIG. 13. In the original full IC field width scan method 300 as shown in FIG. 8, 15 scan lanes are needed to scan a 300 mm wafer. In order to take advantage of full 26 stripes of the MSSW of the electron beam writer 100, the scan lane are arranged in 322a, 322b, and 322c for each scan lane with the scan lane width 26 mm matching the MSSW 26 mm of the electron beam writer 100. The data 324a is for scan lane 322a, data 324b is for scan lane 322b, and data 324c is for scan lane 322b respectively as shown in FIGS. 13 and 14. Thus, instead of 15 scans in the original full IC field scan method 300, now only 11 scans are needed for the rearranged lane scan method 600, and a thirty percent (30%) scan time is saved, and therefore throughput increases by sixty percent (40%).

Figure 15:
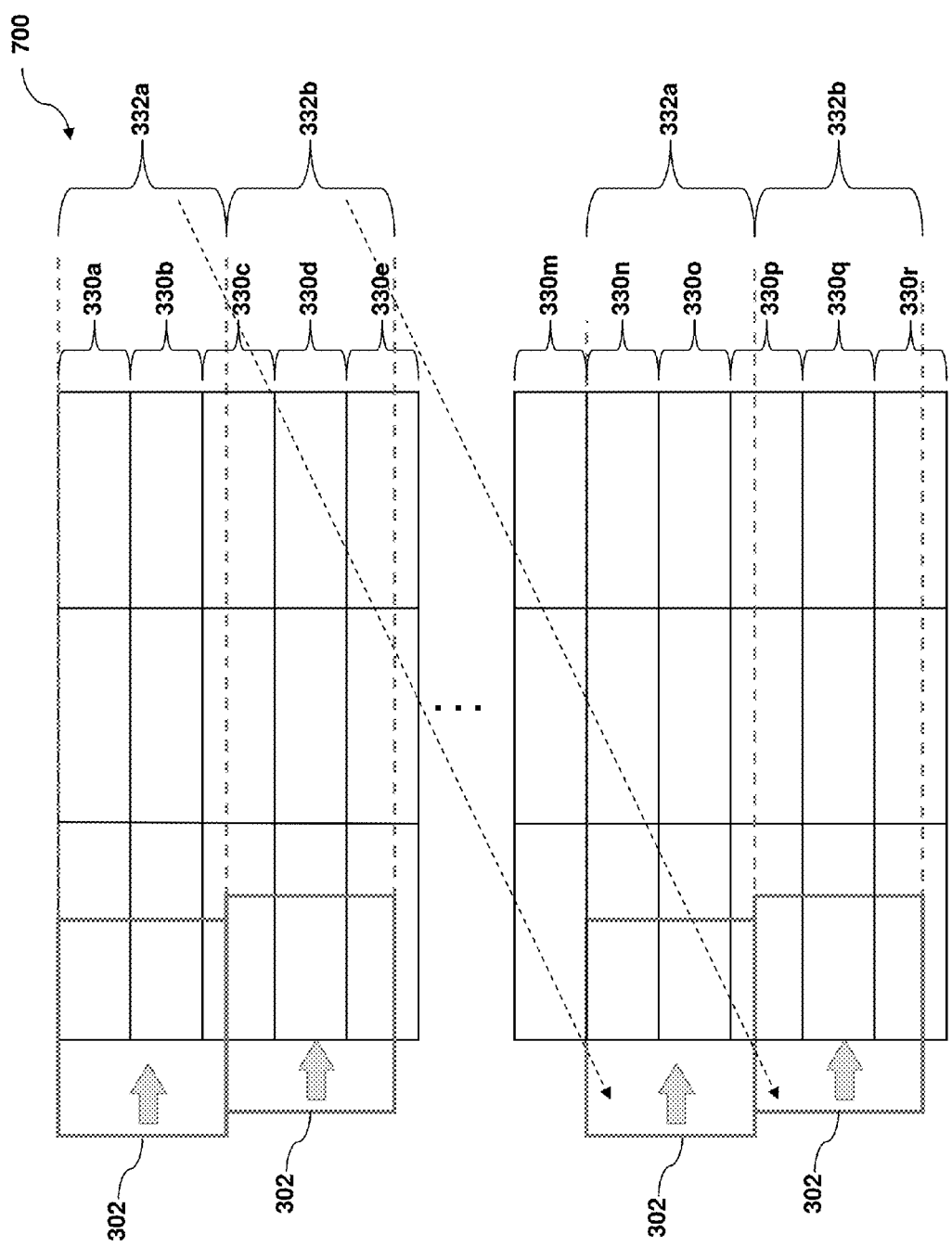
FIG. 15 is a diagram of a scan method in an electron beam write according to one or more embodiments of the present disclosure.

Referring now to FIG. 15, a schematic diagram of a method 700 is an example of exposing a photo resist film 116 coated on a wafer substrate 114 by using the MSW 302 according to one or more embodiments of the present disclosure. In the method 700, because of the small IC field size as 330a-r in x direction, the scan lane 332a can scan the wafer twice without input data rearrangement as shown in FIG. 15 to save the data loading time. Based on the data rearrangement, the repetitive scan lane with the same data can be located by finding the least common multiple (LCM) of the MSW and the IC field width (IC field size in x dimension).

For example, for an IC field size 10×22 mm² (10 mm in x dimension and 22 mm in y dimension), the IC field width (IC field size in x dimension) is 10 mm and only 10 stripes are needed to fill the field width in the electron beam writer 100. In the original full IC field width scan method 300 as shown in FIG. 8, 30 scan lanes are needed to scan a 300 mm wafer. In order to take advantage of full 26 stripes of the MSW of the electron beam writer 100, the scan can be arranged in scan lane 332a and 332b as show in FIG. 15 with the scan lane width 26 mm matching the MSW 26 mm of the electron beam writer 100. Because of the small IC field width (IC field size in x dimension), the scan lane 332a can scan the wafer two times without data rearrangement. the repetitive scan lane with the same data can be located by finding the least common multiple (LCM) of the maximum scan width and the IC field width (IC field size in x dimension). Because the MSW is 26 mm and the IC field width (IC field size in x dimension) is 10 mm in the example, the least common multiple (LCM) is 130 mm and therefore the second time scan on the wafer for scan lane 332a begins at field row 330n. When the scan lane 332a is scanning on the wafer for the second time, the data for scan lane 332b is arranged and loaded in the memory buffer. The scan lane 332b begins next to the scan lane 332a. At the end, only 11 scan lanes are needed to scan a 300 mm wafer. Comparing 30 scan lanes needed by using full field scan method 300, sixty seven percent (67%) scan time is saved and therefore the throughput is triple.

Thus, the present disclosure described a method utilizing the MSW, such as putting a design IC field width (IC field size in x dimension) constraint. The design IC field width (IC field size in x dimension) is limited to the size obtained by dividing the MSW of an electron beam writer by a natural integer numbers (N=1, 2, 3 and so on). In such way the one single IC field or multiple IC fields are fully covered in x direction by a scan, and a wafer is scanned using the MSW without data reloading, and therefore the scan time for a wafer is decreased and the throughput is increased.

The present disclosure also describes another method utilizing the MSW without IC field size constraint by rearranging the scan lane data during each scan. During the electron beam scan, the data for next lane is rearranged and loaded into a large memory buffer. When the scan is finished for one lane, the data in the memory buffer is ready for scanning. Therefore the scan with the MSW continues without interruption and improved the throughput.

In another embodiment, a method of forming a photo resist pattern by utilizing the MSW on the electron beam writer. A photo resist is coated on a wafer substrate by a spin-on process to form a film. The photo resist film coated on the wafer substrate is exposed on an electron beam writer by using the MSW to scan the wafer. By design IC field size constraining or rearranging the data for next lane scan during a scan, the MSW is used for all devices to increase the wafer throughput.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for exposing a wafer substrate, comprising:
    receiving an IC design layout data;
    modifying the IC design layout data using an electron proximity correction (EPC) technique;
    arranging the modified IC design layout data for a scanning lane comprising original integrated circuit (IC) fields having an original IC field width less than a maximum electron beam width of an electron beam writer;
    converting the modified IC design layout data to electron beam format data;
    rearranging the electron beam format data for a scanning lane having a scanning lane width that matches the maximum electron beam width;
    locating a repetitive scanning lane having the same electron beam format data by finding a least common multiple (LCM) of a value of the maximum electron beam width and a value of the original IC field width; and
    writing the rearranged electron beam format data on a substrate using the electron beam writer, wherein the maximum electron beam width spans a plurality of original IC fields in a direction perpendicular to a scan direction.

2. The method of claim 1, further comprising flattening the IC design layout data,
    wherein flattening the IC design layout data includes a decomposition of a basic IC design layout pattern and an elimination of pattern overlap.

3. The method of claim 1, wherein the electron proximity correction (EPC) includes a dose correction, a pattern size bias correction, a pattern shape correction, and a background dose equalization correction.

4. The method of claim 1, wherein arranging the modified IC design layout data for the scanning lane includes filling the scanning lane to the maximum electron beam width with the modified IC design layout data.

5. The method of claim 1, further comprising splitting the scanning lane into a plurality of stripes.

6. The method of claim 5, further comprising splitting a stripe into a multiple of sub stripes.

7. The method of claim 6, further comprising splitting a sub-stripes into a multiple of sub-sub-stripes and assigning the sub-sub-stripes to a plurality of electron beams.

8. The method of claim 7, wherein the step of converting includes converting the modified IC design layout data in the sub-sub-stripes to the electron beam format data and assigning the sub-sub-stripes to a plurality of electron beams.

9. The method of claim 1, wherein the substrate is a resist coated wafer, and the step of writing includes scanning the resist layer by using the maximum electron beam width of the electron beam writer.

10. A method for patterning a wafer substrate, comprising:
receiving an integrated circuit (IC) design layout data;
receiving a maximum electron beam width of an electron-beam writer;
performing an electron proximity correction (EPC) to the IC design layout data, thereby generating modified IC design layout data;
arranging the modified IC design layout data for a scanning lane comprising original integrated circuit (IC) fields having an original IC field width less than the maximum electron beam width;
splitting the scanning lane into a plurality of stripes;
converting the arranged and modified IC design layout data to electron beam format data;
rearranging the electron beam format data for a scanning lane having a scanning lane width that matches the maximum electron beam width;
locating a repetitive scanning lane having the same electron beam format data by finding a least common multiple (LCM) of a value of the maximum electron beam width and a value of the original IC field width; and
scanning the rearranged electron beam format data along the plurality of stripes using the electron beam writer, wherein the maximum electron beam width spans a plurality of original IC fields in a direction perpendicular to a scan direction.

11. The method of claim 10, further comprising:
coating a resist film on a wafer substrate prior to scanning, so that the scanning exposes the resist film; and
developing the exposed resist film to form a resist pattern.

12. The method of claim 11, wherein the electron beam format data is rearranged in a time between scanning consecutive scanning lanes.

13. The method of claim 11, further comprising scanning the repetitive lane with the same electron beam format data.

14. A method for exposing a wafer substrate, comprising:
receiving an integrated circuit (IC) design layout data;
arranging the IC design layout data for a scanning lane comprising original integrated circuit (IC) fields having an original IC field width less than a maximum electron beam width of an electron beam writer;
converting the arranged IC design layout data to electron beam format data;
rearranging the electron beam format data for a scanning lane having a scanning lane width that matches the maximum electron beam width;
locating a repetitive scanning lane having the same electron beam format data by finding a least common multiple (LCM) of a value of the maximum electron beam width and a value of the original IC field width; and
writing the rearranged electron beam format data on a substrate using the electron beam writer such that the maximum electron beam width spans more than one original IC field in a direction perpendicular to a scan direction.

15. The method of claim 14, further comprising:
modifying the IC design layout data using an electron proximity correction (EPC) technique;
arranging modified IC design layout data for a scanning lane; and
converting the modified IC design layout data arranged into the scanning lane to electron beam format data.

16. The method of claim 14, wherein the writing the rearranged electron beam format data on a substrate includes scanning a stripe that spans to an integer number of original IC fields in the scan direction.

17. The method of claim 1, wherein the electron beam format data is rearranged in a time between scanning consecutive scanning lanes.

18. The method of claim 1, further comprising scanning the repetitive lane with the same electron beam format data.

19. The method of claim 14, wherein the electron beam format data is rearranged in a time between scanning consecutive scanning lanes.

20. The method of claim 14, further comprising scanning the repetitive lane with the same electron beam format data.

* * * * *